United States Patent
Liu et al.

(10) Patent No.: US 6,774,007 B2
(45) Date of Patent: Aug. 10, 2004

(54) METHOD OF FABRICATING SHALLOW TRENCH ISOLATION

(75) Inventors: Hsien-Wen Liu, Tainan (TW); Hui Min Mao, Tainen Hsien (TW); Yi-Nan Chen, Taipei (TW); Yi-Chen Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/244,988

(22) Filed: Sep. 17, 2002

(65) Prior Publication Data
US 2003/0201473 A1 Oct. 30, 2003

(30) Foreign Application Priority Data
Apr. 24, 2002 (TW) ........................................ 91108410 A

(51) Int. Cl.⁷ ................................................ H01L 21/76
(52) U.S. Cl. ...................................... 438/424; 438/400
(58) Field of Search ................................ 438/294–297, 438/400, 424; 257/E21.536, E21.545, E21.546, 296–315; 216/39

(56) References Cited

U.S. PATENT DOCUMENTS 6,511,888 B1 * 1/2003 Park et al. ................... 438/296
2002/0134754 A1 * 9/2002 Kim ............................ 216/39

OTHER PUBLICATIONS

S. Wolf, "Silicon Processing for the VLSI Era", Volume 3—The Submicron MOSFET, p. 372; Lattice Press, Sunset Beacj, California (ISBN:0–961672–5–3), 1995.*

* cited by examiner

Primary Examiner—Minhloan Tran
Assistant Examiner—Johannes Mondt
(74) Attorney, Agent, or Firm—Quintero Law Office

(57) ABSTRACT

A method of fabricating shallow trench isolation. In the method, a refill step of oxide layer and a step of forming a sacrificial layer on the semiconductor substrate are applied after filling insulating layer into the shallow trenches. The purpose of the steps is to protect the oxide layer on the semiconductor substrate and the corner of the shallow trenches, used to isolate the STI.

9 Claims, 7 Drawing Sheets

US 6,774,007 B2

METHOD OF FABRICATING SHALLOW TRENCH ISOLATION

BACKGROUND OF THE INVENTION

1. Field of the Invention

The present invention relates to the field of integrated circuits manufacturing technology. More particularly, the invention relates to a method for fabrication of shallow trench isolation whereby corner erosion of shallow trench isolation is avoided and the performance of the semiconductor device is thereby improved.

2. Description of the Related Art

Filling the shallow trench in the semiconductor substrate with insulating materials, such as silicon dioxide, by high density plasma-chemical vapor deposition (HDPCVD) to form shallow trench isolation (STI) has gradually replaced the conventional Local Oxidation of Silicon (LOCOS) method to become the major method of active region isolation. The method of fabricating STI in the prior art, in general, consists of defining the shallow trench first by removing part of the pad layer and semiconductor substrate after the pad layer is formed on the semiconductor substrate. Second, "pull-back" is performed on the pad layer to "pull back" the pad layer and expose part of the surface of the semiconductor substrate and its corner formed with the opening of the shallow trench. Thermal oxide film and nitride liner film are sequentially formed to cover the surface of the semiconductor substrate and the inner walls of the shallow trench. However, because of corner thinning, the thickness of the thermal oxide film formed on the corner is thinner than that formed on the surface of the semiconductor substrate or the inner walls of the shallow trench. Then the shallow trench is filled with insulating materials, such as silicon dioxide, by high-density plasma-chemical vapor deposition (HDPCVD) and so on. Then the exposed thermal oxide film and the nitride liner film are sequentially removed by isotropic etching. The rest of the thermal oxide film and the silicon nitride pad thin film are over-etched to expose the opening of the shallow trench and the corner of the surface of the semiconductor substrate. Later, after forming the gate oxide and the gate on the surface of the semiconductor substrate, current leakage is likely to occur in the gate oxide on the corner because of corner thinning. Thus the reliability of the gate is lowered, and the performance of the metal oxide semiconductor transistors is affected. The following refers to FIG. 1A to FIG. 1F showing a cross-section of STI fabrication to describe the process thereof.

In FIG. 1A, a semiconductor substrate 100 is provided. A pad layer 105 with a pad silicon oxide layer 102 and a pad silicon nitride layer 104 is formed on the surface of the silicon substrate 100. Next, part of the pad layer 105 is removed to define an opening (not shown), then pad layer 105 is used as a mask to perform isotropic etching to form shallow trenches 106 in the semiconductor substrate 100. Next, "pull-back" is performed on the pad layer 105: an anisotropic etching is performed to remove part of the pad layer 105 around the opening of shallow trenches 106, then part of the surface of the semiconductor substrate and its corner 107 between the opening of shallow trenches are exposed.

Next, in FIG. 1B, a thermal oxide film 110 is formed on the inner walls of the shallow trenches 106 and the exposed surface of the semiconductor substrate 100 by thermal oxidation. Because of corner thinning, the thickness of the thermal oxide film 110 on the inner walls of the shallow trenches 106 and the exposed surface of the semiconductor substrate 100 is greater than that on the corner 107.

In FIG. 1C, pad silicon oxide layer 102 and thermal oxide film 110 are shown as a first oxide layer 112 for convenience of explanation. A nitride liner film 120 is deposited by CVD to cover the sidewalls of the pad silicon nitride layer 140 and the surface of the first oxide layer 112 in the shallow trenches 106.

Next, in FIG. 1D, an insulating layer (not shown) of, for example, high-density plasma oxide (HDP Oxide), is formed to fill up the shallow trenches 106. Then, part of the insulating layer is removed by a Deglaze step using HF-type etching agents to form a first opening 108. The rest of the insulating layer is represented as insulating layer 130. The insulating layer 130 is divided into the top part 134 and the bottom part 132, because the top part 134 is formed in the space surrounded by the "pulled-back" pad layer 105, thus its width is greater than the bottom part 132.

In FIG. 1E, anisotropic etching is performed to remove the pad silicon nitride layer 104 and part of the nitride liner film 120, thus the top part of the insulating layer 134 and its sidewalls and part of the first oxide layer 112 are exposed. Furthermore, part of the nitride liner film 120 under the top part of the insulating layer 134 is over-etched, thus the second opening 124 is formed. The rest of the nitride liner film 120 is represented as the rest of the nitride liner film 120'.

Next, in FIG. 1F, the first oxide layer 112 not covered with the rest of the nitride liner film 120' is removed by isotropic etching, thus the surface of the semiconductor substrate 100 is exposed. Furthermore, part of the first oxide layer 112 under the top part of the insulating layer 134 and the rest of the nitride liner film 120' is over-etched, thus the corner 107 is exposed and the third opening 142 is formed. The rest of the first oxide layer 112 is represented as the rest of the first oxide layer 112'. So far the conventional steps of fabricating STI are completed.

According to the conventional process, the corner is exposed after the pad oxide layer on the semiconductor substrate is removed. Later in the semiconductor manufacturing process, after the gate oxide and the gate are formed on the semiconductor substrate, current leakage is likely to occur at the gate oxide formed on the corner because of corner thinning. Thus the reliability of the gate is lowered, and the performance of the metal oxide semiconductor transistor is affected.

SUMMARY OF THE INVENTION

Therefore, the purpose of the invention is to provide a method of fabricating STI, in which a refill step of oxide layer and a step of forming a sacrificial layer on the semiconductor substrate are applied after filling an insulating layer into the shallow trenches. The purpose of the steps is to protect the oxide layer on the semiconductor substrate and the corner of the shallow trenches, used to isolate the STI.

Thus, the invention provides a method of fabricating shallow trench isolation on a semiconductor substrate, comprising: forming a pad layer on the semiconductor substrate; removing part of the pad layer to form an opening, then using the pad layer as mask to define a shallow trench in the semiconductor substrate; removing part of the pad layer around the opening of the shallow trenches to expose the surface of the semiconductor substrate thereunder and form a corner between the surface of the semiconductor substrate and the opening of the shallow trenches; forming a thermal oxide film on the surface of the semiconductor substrate exposed in the sidewalls of the shallow trenches to constitute a first oxide layer with the pad layer; forming a nitride liner film to cover the surface of the first oxide layer on the sidewalls of the shallow trenches and the pad layer on the opening of the shallow trenches; forming an insulating layer to fill the shallow trenches; forming a first opening by removing part of the insulating layer in the shallow trenches, such that the rest of the insulating layer is divided into top and bottom parts; removing the pad silicon nitride layer and the nitride liner film not covered with the top part of the insulating layer to expose the top part of the insulating layer, its sidewalls and part of the first oxide layer, such that the nitride liner film under the top part of the insulating layer is over-etched to form a second opening; forming a second oxide layer to cover the upper surface of the top part of the insulating layer and the surface of the first oxide layer exposed at the sidewalls of the top part of the insulating layer, and to fill the second opening; removing the second oxide layer and the first oxide layer not covered with the top part of the insulating layer and the surface of the semiconductor substrate is exposed, wherein part of the first oxide layer under the top part of the insulating layer is removed by over-etching, thus the third opening is formed; forming a sacrificial oxide layer on the exposed semiconductor substrate such that part of the third opening is filled to constitute a third oxide layer with the rest of the first oxide layer; forming a fourth oxide layer to cover the upper surface of the top part of the insulating layer, its sidewalls and the surface of the third oxide layer, and to fill the third opening; and removing the fourth oxide layer and part of the third oxide layer such that the upper surface of the top part of the insulating layer, its sidewalls, and the surface of the semiconductor substrate are exposed to form a shallow trench isolation comprising the top part and the bottom part of the insulating layer.

According to the preferred embodiment of the present invention, the semiconductor substrate is silicon or germanium. The substrate is formed by Epitaxy or silicon-on insulating materials. The insulating layer, the second oxide layer and the third oxide layer are all boron-phosphorous-silicon glass (BPSG), non-doping silicon glass (NSG), high-density plasma (HDP) oxide, or tetraethylethoxide (TEOS) by chemical vapor deposition (CVD), atmospheric-pressure CVD (APCVD), sub-atmospheric-pressure CVD (SAPCVD), low-pressure CVD (LPCVD), plasma-enhanced CVD (PECVD), or high-density plasma CVD (HDPCVD).

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1A:
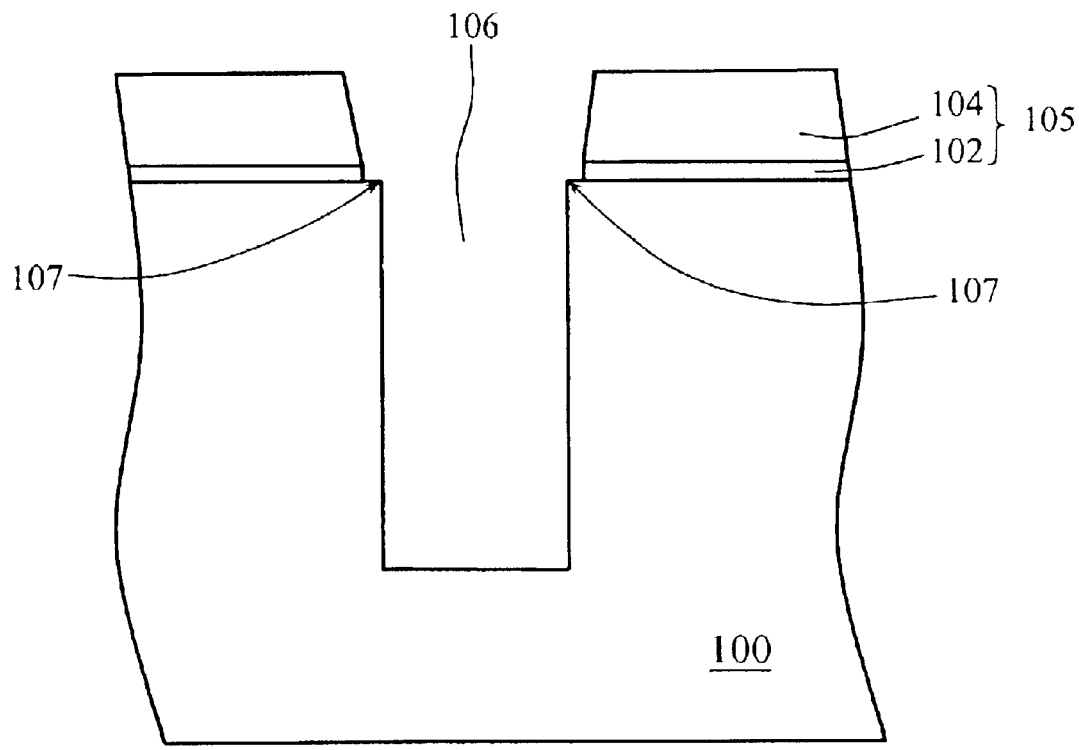
FIGS. 1A to 1F show cross-sections of the manufacturing process of the conventional shallow trench isolation.
Figure 1B:
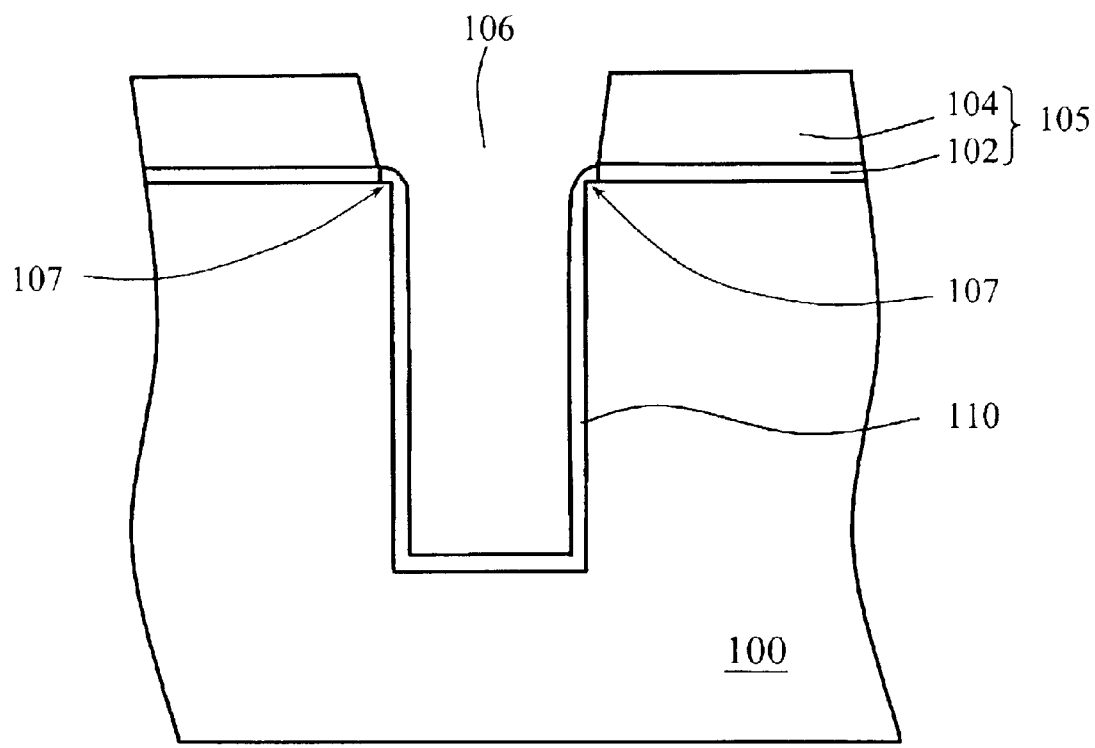
Figure 1C:
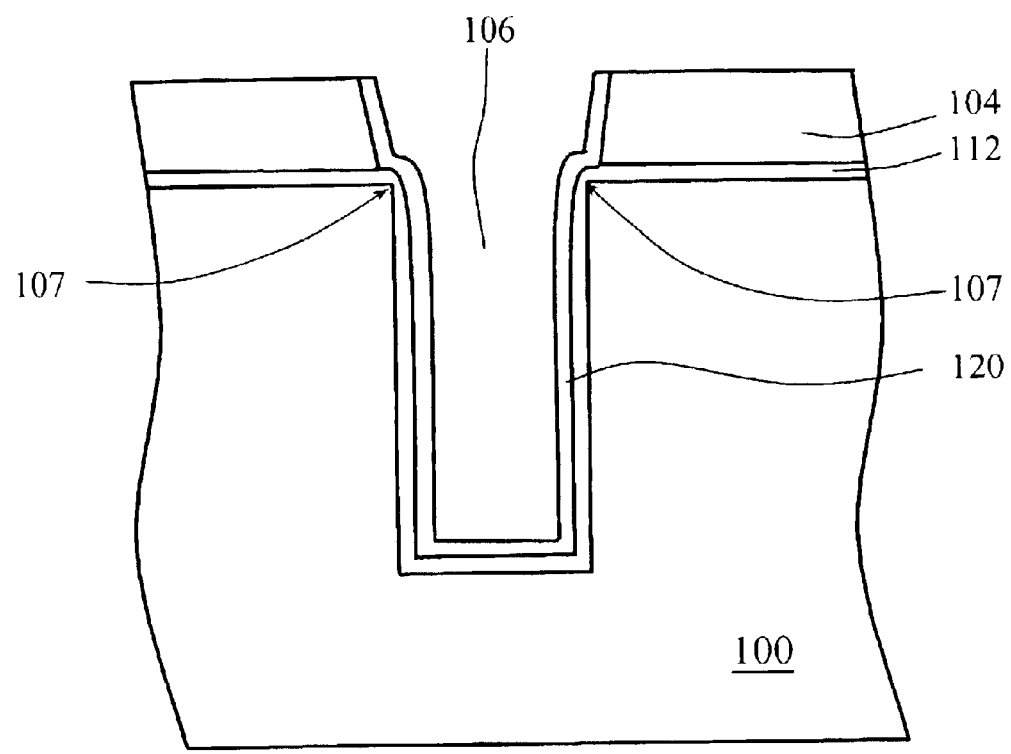
Figure 1D:
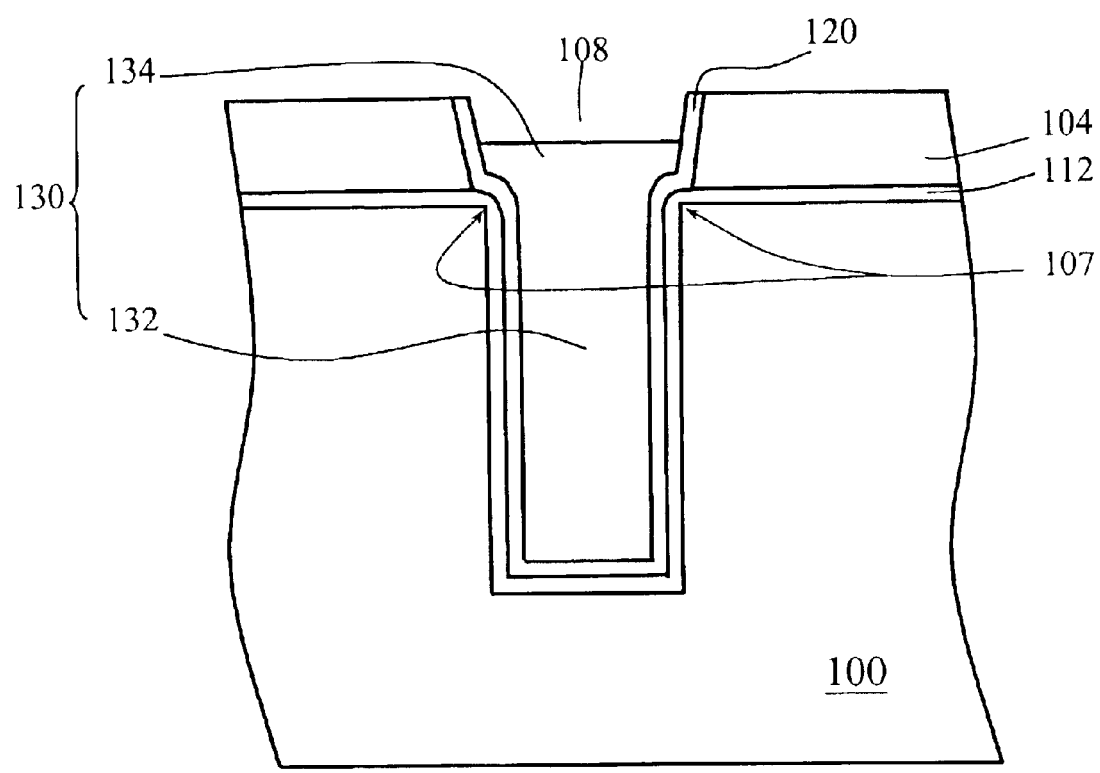
Figure 1E:
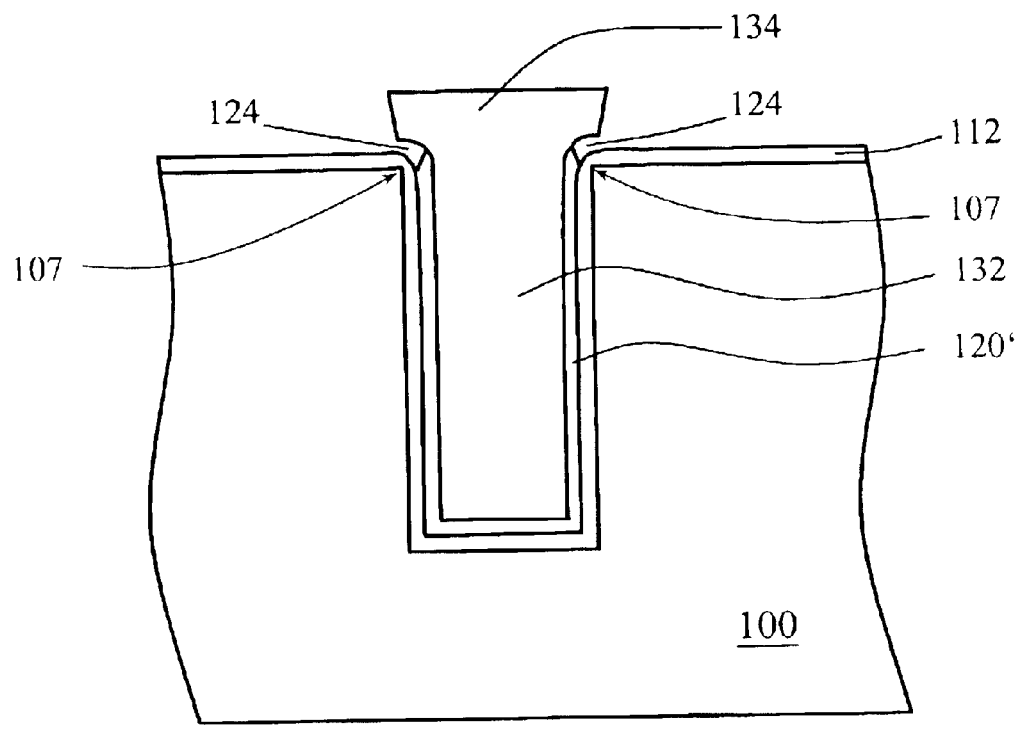
Figure 1F:
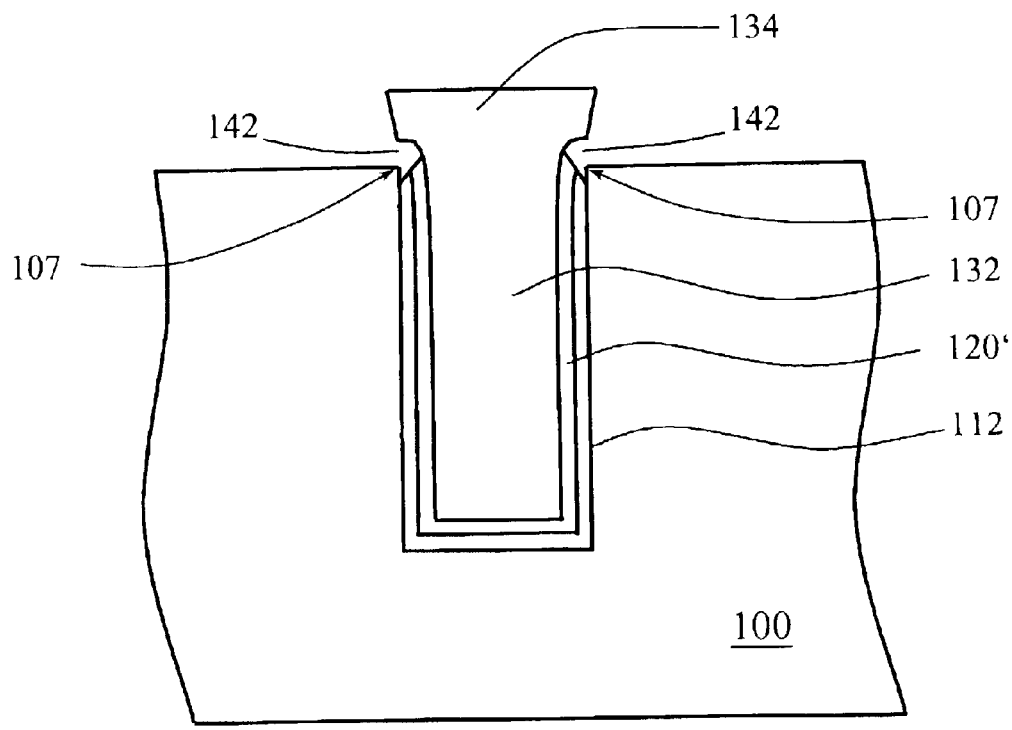
Figure 2A:
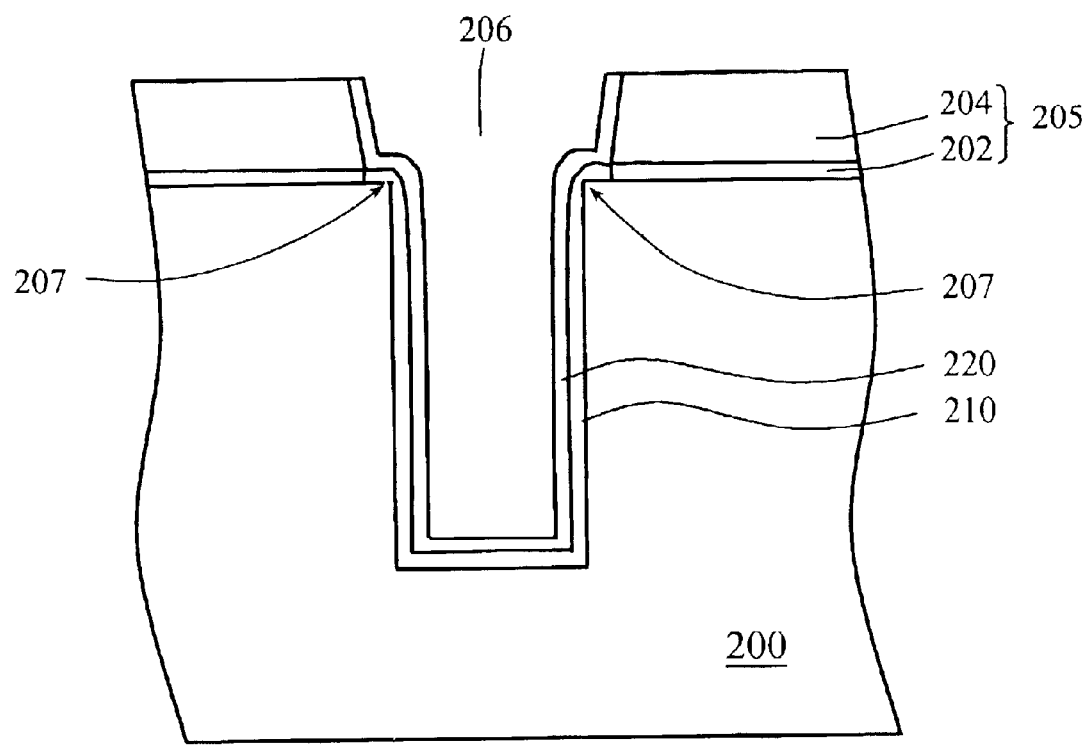
FIGS. 2A to 2H show cross-sections of the manufacturing process of shallow trench isolation in accordance with the preferred embodiment of the present invention.

In FIG. 2A, a semiconductor substrate, for example silicon substrate 200, is provided. A pad layer 205 with a pad silicon oxide layer 202 and a pad silicon nitride layer 204 is formed on the surface of the silicon substrate 200. The pad silicon oxide layer 202 about 100–600 Å thick is formed on the surface of the silicon substrate 200 by oxidization method, and the pad silicon nitride layer 204 about 1600–3000 Å thick is formed by CVD. Next, part of the pad layer 205 is removed to define an opening (not shown), then the pad layer 205 is used as a mask to perform anisotropic etching to form shallow trenches 206 in the silicon substrate 200. Next, "pull-back" is performed on the pad layer 205: an anisotropic etching is performed to remove part of the pad layer 205 around the opening of shallow trenches 206 and thus enlarge the opening of shallow trenches 206, then part of the surface of the silicon substrate 200 and its corner 207 between the opening of shallow trenches 206 are exposed. Then a thermal oxide film 210 is formed on the exposed surface of silicon substrate 200 inside the shallow trenches 206 by thermal oxidation. The thickness of the thermal oxide film 210 is about 80–140 Å. For convenience, the pad silicon oxide layer 202 and the thermal oxide film 210 are represented together as a first oxide layer 212. Then a nitride liner film 220 is deposited evenly by CVD on the surface of the first oxide layer 212 at inner walls of the shallow trenches 206 and the sidewalls of the pad layer 205 around the opening of the shallow trenches 206. The thickness of the nitride liner film 220 is about 80–140 Å.

Figure 2B:
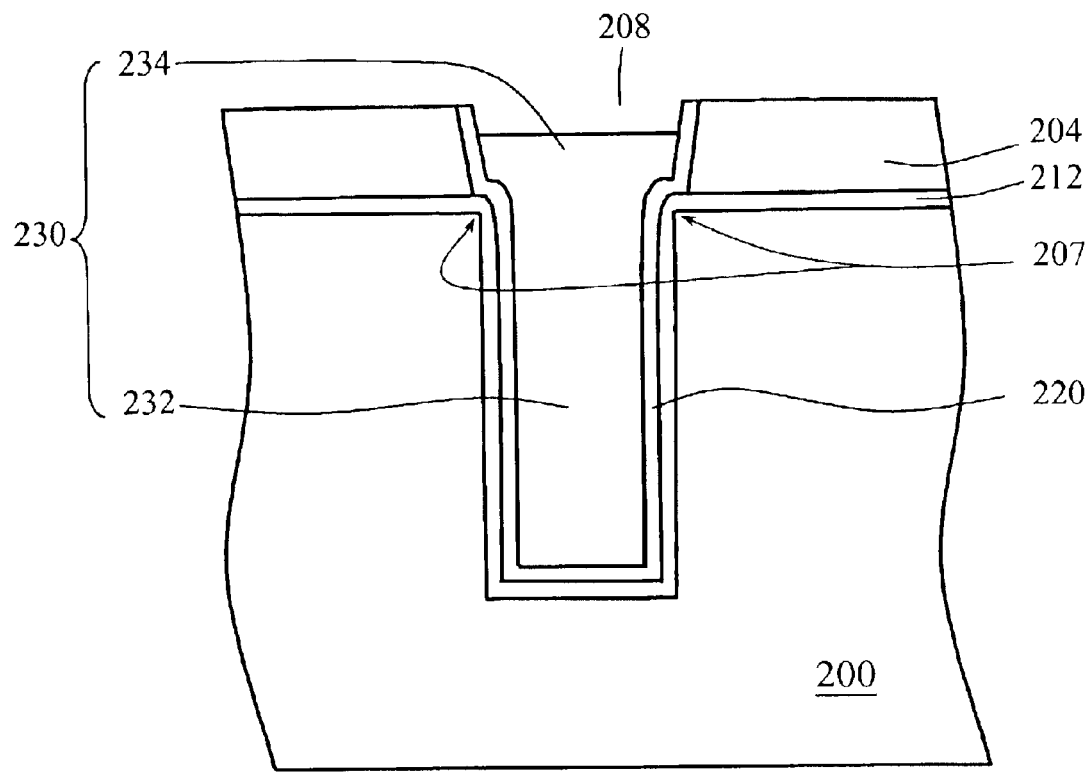

Next, in FIG. 2B, an insulating layer (not shown) of HDP Oxide is formed to fill up the shallow trenches 206 by, for example, CVD. Then, part of the insulating layer is removed by a Deglaze step using HF-type etching agents to form a first opening 208. The rest of the insulating layer is represented as the insulating layer 230. The insulating layer 230 is divided into the top part 234 and the bottom part 232 by position, because the top part 234 is formed in the space surrounded by the "pulled-back" pad layer 205, thus its width is greater than the bottom part 232.

Figure 2C:
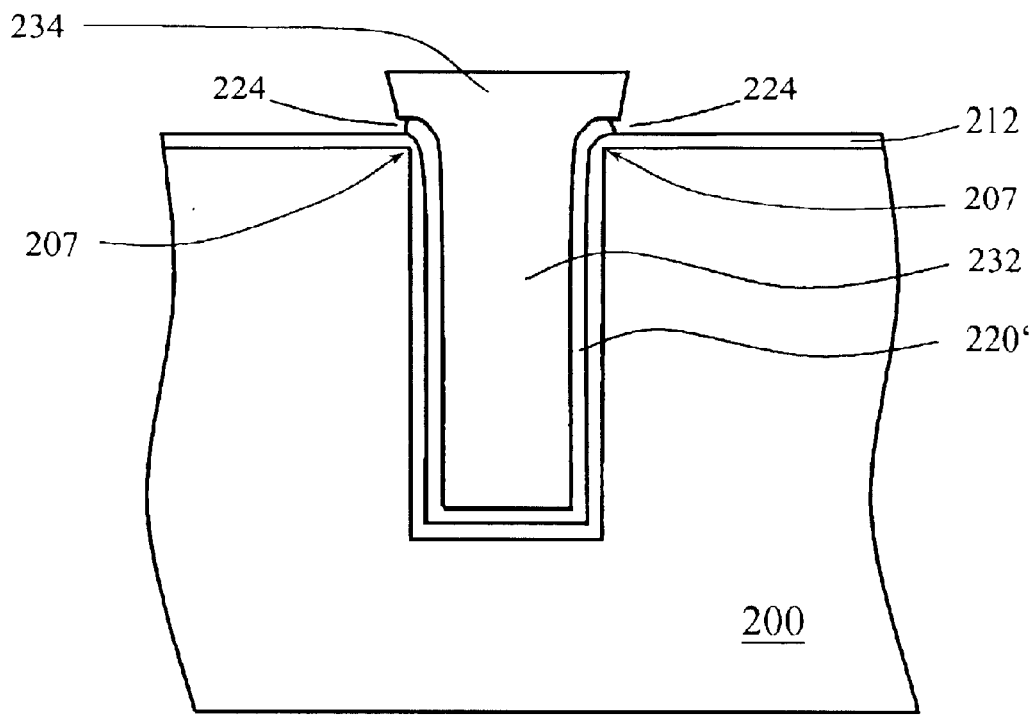

Next, in FIG. 2C, etching, for example, isotropic etching, is performed to remove the pad silicon nitride layer 204 and part of the nitride liner film 220 not covered with the top part of the insulating layer 234, thus the top part of the insulating layer 234, its sidewalls and part of the first oxide layer 212 are exposed. Furthermore, part of the nitride liner film 220 under the top part of the insulating layer 234 is over-etched, thus the second opening 224 is formed. The rest of the nitride liner film 220 is represented as the rest of the nitride liner film 220'.

Figure 2D:
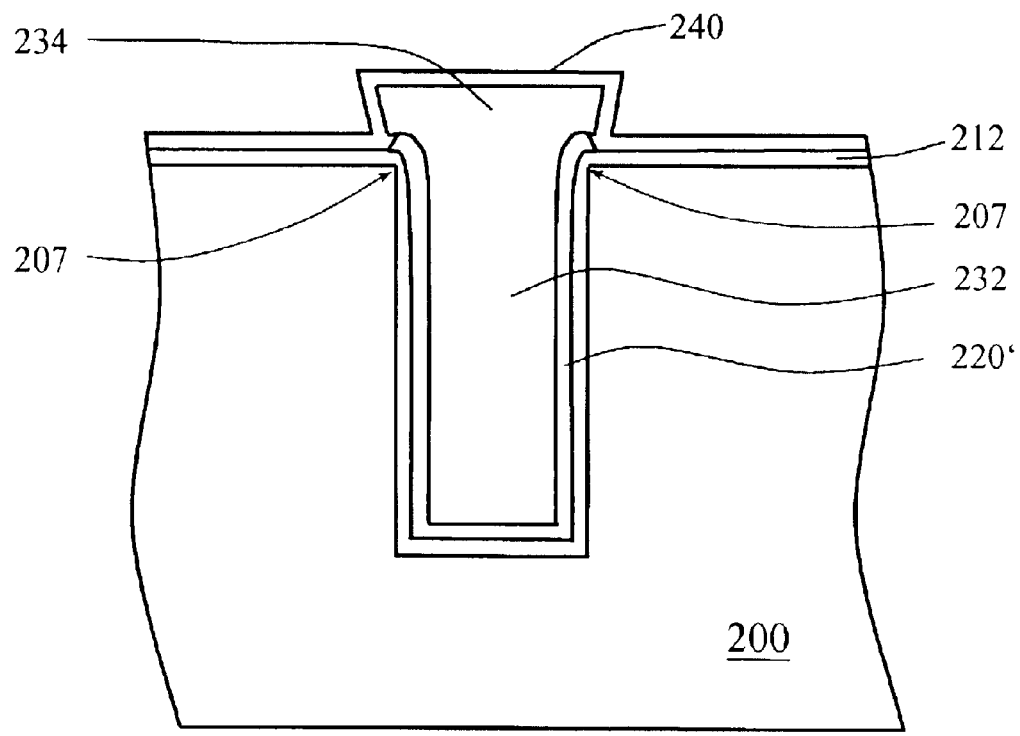

Next, in FIG. 2D, a second oxide layer 240 of about 100–200 Å is deposited on the exposed upper surface of the top part of the insulating layer 234, its sidewalls, and the exposed surface of the first oxide layer 212, to fill up the second opening 224. The second oxide layer 240 of, for example, HDP Oxide, is formed by, for example, CVD.

Figure 2E:
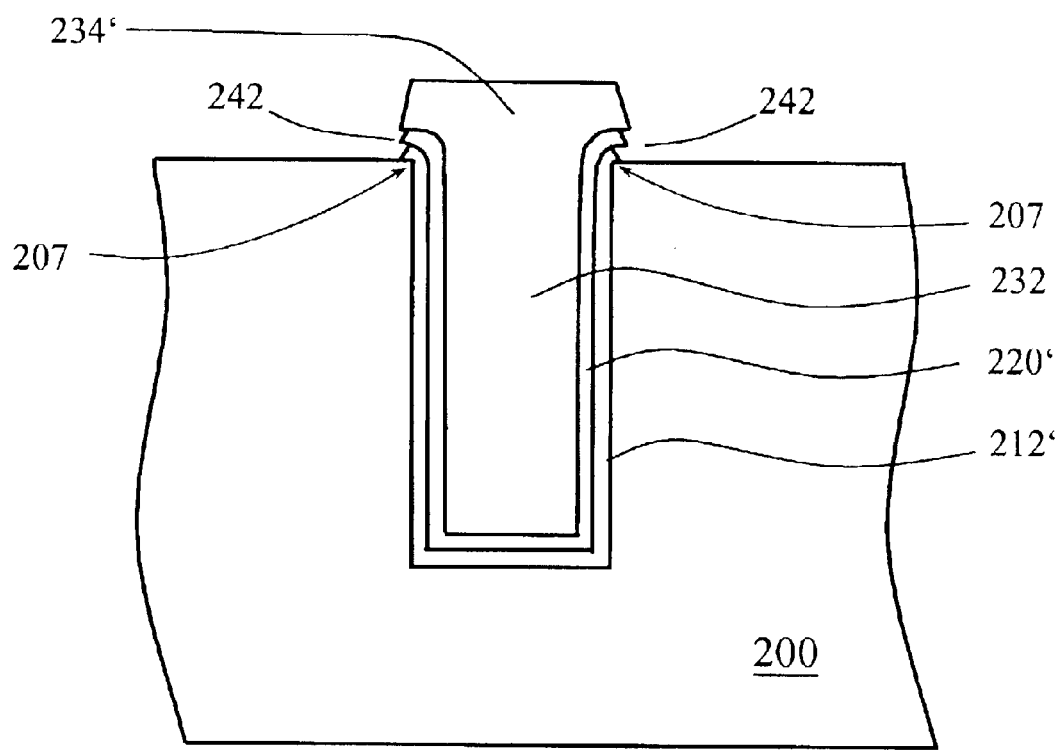

FIG. 2E shows etching, for example isotropic etching, performed to remove the second oxide layer 240 and the first oxide layer 212 not covered with the top part of the insulating layer 234, thus the surface of the silicon substrate 200 is exposed. Furthermore, part of the first oxide layer 212 under the top part of the insulating layer 234 is removed by over-etching and drawn back under the rest of the nitride liner film 220', thus the third opening 324 is formed. During this etching, the top part of the insulating layer 234 is etched as well due to similar composition with the first oxide layer 212 and the second oxide layer 240. The rest of the top part of the insulating layer is represented as the rest of the top part of the insulating layer 234', and the rest of the first oxide layer 212 is represented as the rest of the first oxide layer 212'. The purpose of this step is to confirm that corner 207 is well covered with the first oxide layer 212 to avoid the drawback of short protection of the rest of the first oxide layer 212', thereby exposing the corner 207.

Figure 2F:
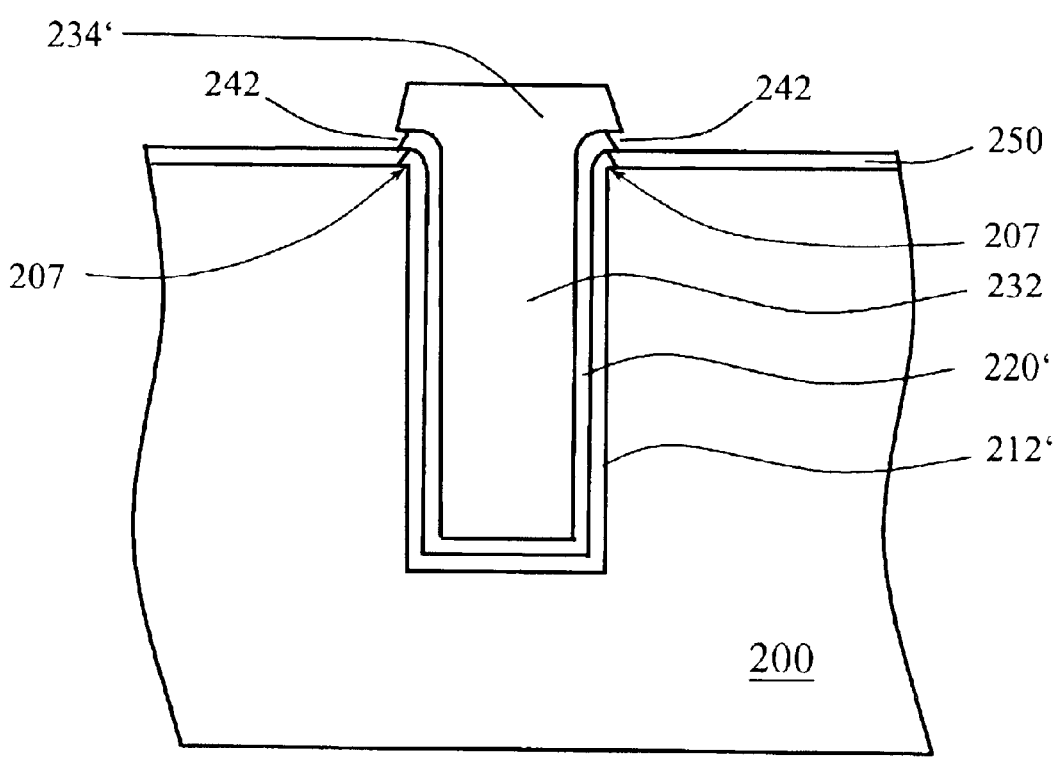

Next, in FIG. 2F, oxidization is performed to form a sacrificial oxide layer 250 on the exposed surface of the silicon substrate 200. Part of the third opening 242 is filled with the sacrificial oxide layer 250.

Figure 2G:
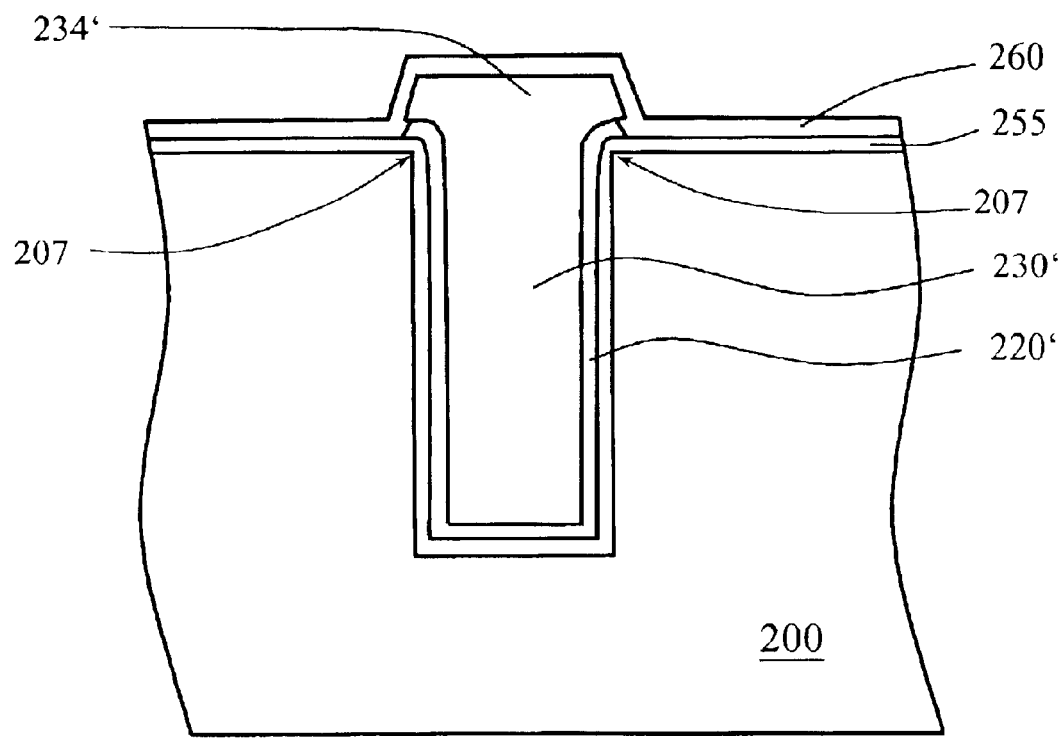

Next, in FIG. 2G, a third oxide layer 260 of about 100–200 Å is deposited on the upper surface of the rest of the top part of the insulating layer 234', its sidewalls, and the surface of the sacrificial oxide layer 250. The third opening is filled up with the third oxide layer 260. The third oxide layer 260 of, for example, HDP Oxide, is formed by, for example, CVD. For convenience, the rest of the first oxide layer 212' and the sacrificial oxide layer 250 are represented together as oxide layer 255.

Figure 2H:
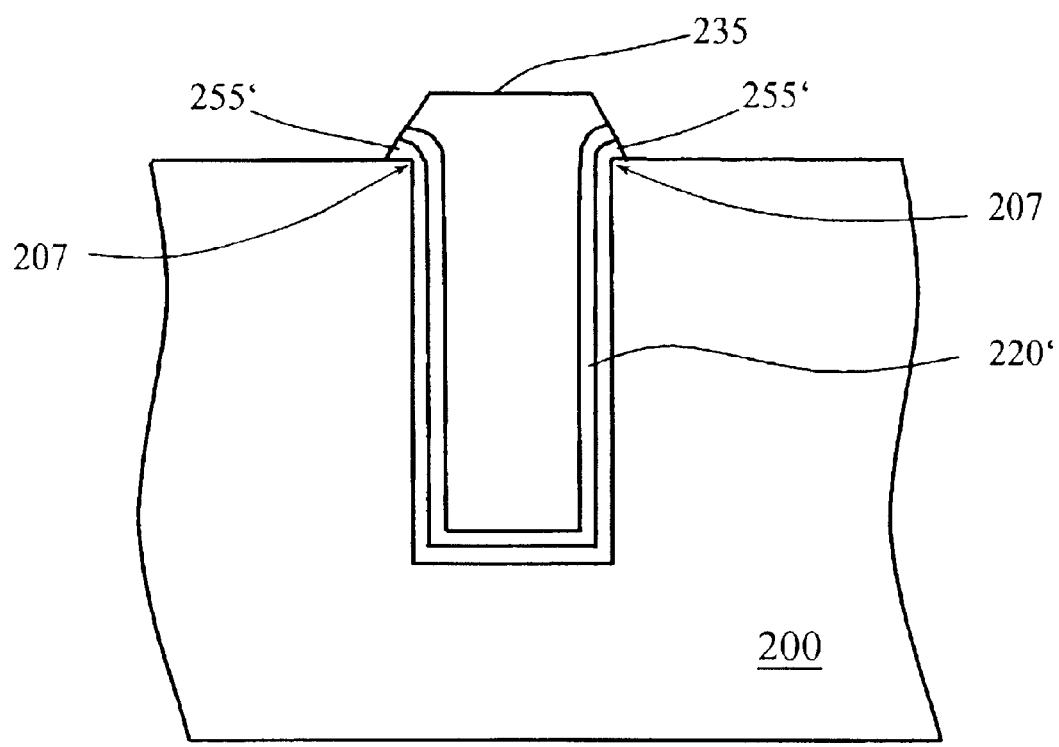

Next, in FIG. 2H, etching, for example an isotropic etching, is performed to remove the third oxide layer 260 and part of the oxide layer 255, thus the upper surface of the rest of the top part of the insulating layer 234', its sidewalls, and the surface of the silicon substrate 200 is exposed. The rest of the oxide layer 255 is represented as the rest of the oxide layer 255'. The purpose of this step is to confirm that the corner 207 is covered with the rest of the oxide layer 255' to avoid the drawbacks of the prior art. During this etching, the top and the sidewalls of the rest of the top part of the insulating layer 234' is etched as well due to similar composition with the third oxide layer 260 and the oxide layer 255, thus its width and height are slightly reduced. Eventually, the rest of the top part of the insulating layer 234' is cut at the same level with the rest of the oxide layer 255' and the sidewalls of the rest of the nitride liner film 220'. The rest of the top part of the insulating layer 324', together with the bottom part of the insulating layer 232, composes the shallow trench isolation (STI). So far the fabrication of the STI is completed.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating shallow trench isolation suitable for a semiconductor substrate, comprising:

forming a pad layer on the semiconductor substrate, wherein the pad layer includes a pad silicon nitride layer;

removing part of the pad layer and the semiconductor substrate to form shallow trenches thereon;

removing part of the pad layer around the opening of the shallow trenches to expose the surface of the semiconductor substrate thereunder and form a corner between the surface of the semiconductor substrate and the opening of the shallow trenches;

forming a thermal oxide film on the surface of the semiconductor substrate exposed in the sidewalls of the shallow trenches to constitute a first oxide layer with the pad layer;

forming a nitride liner film to cover the surface of the first oxide layer on the sidewalls of the shallow trenches and the pad layer on the opening of the shallow trenches;

forming an insulating layer to fill the shallow trenches;

forming a first opening by removing part of the insulating layer in the shallow trenches, such that the rest of the insulating layer is divided into top and bottom parts having a top part with greater width than the bottom part does;

removing the pad silicon nitride layer and the nitride liner film not covered with the top part of the insulating layer to expose the top part of the insulating layer, its sidewalls and part of the first oxide layer, such that the nitride liner film under the top part of the insulating layer is over-etched to form a second opening;

forming a second oxide layer to cover the upper surface of the top part of the insulating layer and the surface of the first oxide layer exposed at the sidewalls of the top part of the insulating layer, and to fill the second opening;

removing the second oxide layer and the first oxide layer not covered with the top part of the insulating layer to form a third opening such that the surface of the semiconductor substrate is exposed;

forming a sacrificial oxide layer on the exposed semiconductor substrate such that part of the third opening is filled to constitute a third oxide layer with the rest of the first oxide layer;

forming a fourth oxide layer to cover the upper surface of the top part of the insulating layer, its sidewalls and the surface of the third oxide layer, and to fill the third opening; and removing the fourth oxide layer and part of the third oxide layer such that the upper surface of the top part of the insulating layer, its sidewalls and the surface of the semiconductor substrate are exposed to form a shallow trench isolation comprising the top part and the bottom part of the insulating layer.

2. The method as claimed in claim 1, wherein the semiconductor substrate is a silicon substrate.

3. The method as claimed in claim 1, wherein the pad layer comprises a pad silicon oxide layer and the pad silicon nitride layer.

4. The method as claimed in claim 1, wherein the insulating layer is boron-phosphorous-silicon glass (BPSG), non-doping silicon glass (NSG), high-density plasma (HDP) oxide, or tetraethylethoxide (TEOS).

5. The method as claimed in claim 1, wherein the thickness of the nitride liner film is 80–140 Å.

6. The method as claimed in claim 1, wherein the second oxide layer is boron-phosphorous-silicon glass (BPSG), non-doping silicon glass (NSG), high-density plasma (HDP) oxide, or tetraethylethoxide (TEOS).

7. The method as claimed in claim 1, wherein the thickness of the second oxide layer is 100–200 Å.

8. The method as claimed in claim 1, wherein the fourth oxide layer is boron-phosphorous-silicon glass (BPSG), non-doping silicon glass (NSG), high-density plasma (HDP) oxide, or tetraethylethoxide (TEOS).

9. The method as claimed in claim 1, wherein the thickness of the fourth oxide layer is 100–200 Å.

* * * * *